United States Patent
Yung et al.

(10) Patent No.: US 9,641,077 B2
(45) Date of Patent: May 2, 2017

(54) APPLYING FORCE VOLTAGE TO SWITCHING NODE OF DISABLED BUCK CONVERTER POWER STAGE

(71) Applicant: QUALCOMM Incorporated, San Diego, CA (US)

(72) Inventors: Chi-Fan Yung, San Jose, CA (US); Vishal Gupta, Sunnyvale, CA (US); Joseph Duncan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 43 days.

(21) Appl. No.: 14/609,203

(22) Filed: Jan. 29, 2015

(65) Prior Publication Data

US 2016/0226379 A1 Aug. 4, 2016

(51) Int. Cl.
| | |
|---|---|
| *H02M 3/158* | (2006.01) |
| *H02M 1/32* | (2007.01) |
| *H02M 1/36* | (2007.01) |
| *H02M 3/155* | (2006.01) |
| *G01R 31/40* | (2014.01) |

(52) U.S. Cl.
CPC .............. *H02M 3/158* (2013.01); *H02M 1/32* (2013.01); *H02M 1/36* (2013.01); *H02M 3/155* (2013.01); *G01R 31/40* (2013.01)

(58) Field of Classification Search
CPC .... H02M 3/155; H02M 3/156; H02M 3/1588; H02M 2001/0022; G05F 1/67; Y02B 70/1466
USPC ......................................... 323/282, 289, 299
See application file for complete search history.

(56) References Cited

U.S. PATENT DOCUMENTS

| | | | |
|---|---|---|---|
| 5,561,384 A * | 10/1996 | Reents | H03K 19/0016 327/108 |
| 6,774,666 B1 * | 8/2004 | Samad | G05F 3/262 326/27 |
| 7,911,192 B2 | 3/2011 | Wang | |
| 8,106,711 B2 | 1/2012 | Adamski et al. | |

(Continued)

OTHER PUBLICATIONS

Kursun V., et al., "Cascode Monolithic DC-DC Converter for Reliable Operation at High Input Voltages," Analog Integrated Circuits and Signal Processing, 2005, vol. 42, pp. 231-238.

(Continued)

*Primary Examiner* — Yemane Mehari
(74) *Attorney, Agent, or Firm* — Haynes and Boone, LLP

(57) ABSTRACT

Reliability of a buck power stage may be enhanced by extending the maximum input voltage able to be withstood in the disabled (non-switching) state. During device qualification/testing, a power management unit (PMU) in the disabled state may have its input node subjected to greater than a maximum input voltage permitted for reliability (Vmax). Under such conditions, a force voltage (Vforce) may be selectively applied to the PMU switching node in the disabled state. For a given input voltage (VIN), this reduces voltage across the non-switching transistors of the power stage (and hence the resulting stress) to below Vmax. In certain embodiments, the Vforce applied to the switching node is of a fixed magnitude. In other embodiments, the Vforce applied to the switching node is of a magnitude varying with input voltage. Embodiments may be particularly suited to implement power management for a System-On-Chip (SoC).

20 Claims, 9 Drawing Sheets

(56) References Cited

U.S. PATENT DOCUMENTS

2011/0001462 A1* 1/2011 Couleur ............... H02M 3/155
                                                    323/289
2012/0007572 A1   1/2012 Oddoart
2014/0192441 A1   7/2014 Briere et al.

OTHER PUBLICATIONS

Li Z., "Design of a Step-Down DC-DC Controller Integrated Circuit with Adaptive Dead-Time Control," 2010, 77 pages.

"Integrated Circuit and System Design", Sep. 30, 2009 (Sep. 30, 2009), XP055260604, pp. 336-338, Retrieved from the Internet: URL: http://rd.springer.com/content/pdf/10.1007/978-3-642-11802-9.pdf [retrieved on Mar. 23, 2016].

International Search Report and Written Opinion—PCT/US2016/012607—ISA/EPO—Apr. 5, 2016.

Onizuka K., et al., "Stacked-Chip Implementation of On-Chip Buck Converter for Distributed Power Supply System in SiPs", IEEE Journal of Solid-State Circuits, IEEE Service Center, Piscataway, NJ, USA, Nov. 1, 2007 (Nov. 1, 2007), XP011195893, vol. 42, No. 11, pp. 2404-2410, ISSN: 0018-9200, DOI: 10.1109/JSSC.2007.906204.

\* cited by examiner

APPLYING FORCE VOLTAGE TO SWITCHING NODE OF DISABLED BUCK CONVERTER POWER STAGE

BACKGROUND

The disclosure relates to power management on a chip, and in particular, to improving reliability of a buck converter power stage in the disabled state by applying a force voltage to a switching node. Unless otherwise indicated herein, the approaches described in this section are not admitted to be prior art by inclusion in this section.

For System-On-Chip (SOC) devices, transistors manufactured using a same technology node may be tasked with both power management and data handling roles. In this regard, a SOC PMU (Power Management Unit) offers a design challenge at deeply scaled technology nodes (e.g., 28 nm).

For example, from a power management perspective, the PMU may experience a relatively high input voltage VIN (e.g., V≤4.5V) due to the interface with the battery.

However, from a data management perspective, the maximum voltage (Vmax) which the transistors can withstand may be relatively low (e.g., Vmax=2.0–2.5V for an 1.8V I/O device at 28 nm). For a given technology node this low Vmax constraint can be imposed by considerations of transistor reliability: e.g., Time-Dependent Dielectric Breakdown (TDDB); Hot Carrier Injection (HCI); and Negative Bias Temperature Instability (NBTI).

This issue can offer challenges for designing a conventional buck switching converter power stage. Consider, for example, a conventional buck PMU comprising a PFET/NFET pair.

In the disabled (non-switching) state, the voltage VX at the switching node is typically discharged via the load to a value close to GND, exposing the PFET to a IVGDI (gate to drain voltage) equal to the input voltage VIN. When this VIN exceeds a maximum voltage permissible for reliability purposes (Vmax), so does IVGDI of the PFET. Thus when VIN>Vmax, PMOS reliability can be compromised.

This issue may be addressed by using multiple stacked devices in the power stage, and generating the associated rails to drive and/or bias them. The theoretical maximum allowable VIN is n*Vmax for such a n-stacked power stage.

However, during internal testing/qualification procedures VIN may be raised to a value close to or even exceeding the n*Vmax reliability limit, when the PMU device is in the disabled (non-switching) state. A conventional buck power stage would thus experience this raised VIN (higher than encountered during normal operation) when it is in the disabled state.

Accordingly there is a need to ensure transistors of a buck switching converter power stage are not stressed beyond their reliability limits in the disabled state (e.g., during testing/qualification involving a VIN raised above Vmax).

SUMMARY

Reliability of a buck power stage may be enhanced by extending the maximum input voltage able to be withstood in the disabled (non-switching) state. During device qualification/testing, a power management unit (PMU) in the disabled state may have its input node subjected to greater than a maximum input voltage permitted for reliability (Vmax). Under such conditions, according to embodiments a force voltage (Vforce) may be selectively applied to the PMU switching node in the disabled state. For a given input voltage (VIN), this reduces voltage across the non-switching transistors of the power stage (and hence the resulting stress) to below Vmax. In certain embodiments, the Vforce applied to the switching node is of a fixed magnitude. In other embodiments, the Vforce applied to the switching node is of a magnitude varying with input voltage. Embodiments may be particularly suited to implement power management for System-On-Chip (SoC) devices.

According to an embodiment, an apparatus comprises a buck power stage disposed between a high voltage node and a low voltage node. The buck power stage further comprises a switching node in communication with a load. A voltage buffer is configured to apply a force voltage to the switching node in response to an input signal indicating the buck power stage in a non-switching state.

An embodiment of a system on chip (SOC) comprises a data handling transistor manufactured according to a technology node. A buck power stage comprises a PMOS transistor manufactured according to the technology node and an NMOS transistor manufactured according to the technology node, disposed between a high voltage node and a low voltage node. The buck power stage further comprises a switching node in communication with a load. A voltage buffer is manufactured according to the technology node and configured to apply a force voltage to the switching node in response to an input signal indicating the buck power stage in a non-switching state.

A method according to an embodiment, comprises providing a buck power stage disposed between a high voltage node and a low voltage node, the buck power stage further comprising a switching node in communication with a load. A voltage buffer is configured to apply a force voltage to the switching node in response to an input signal indicating the buck power stage in a non-switching state.

In some embodiments, the voltage buffer is configured to apply the force voltage at a constant value.

In particular embodiments, a value of the high voltage node is configured to vary over time, and the voltage buffer is configured to apply the force voltage varying according to the value.

According to certain embodiments, the voltage buffer is configured to apply the force voltage when the value exceeds a maximum permitted for reliability.

In various embodiments, the voltage buffer may comprise a diode/resistor stack.

In particular embodiments, the buck power stage comprises a first PMOS having a source in communication with the high voltage node and a drain in communication with the switching node. A first NMOS has a drain in communication with the switching node and a source in communication with the low voltage node.

In some embodiments, the buck power stage may comprise a stacked device including a second PMOS between the high voltage node and the source of the first PMOS, and also including a second NMOS between the source of the first NMOS and the low voltage node.

The stacked device may further include a third PMOS between the high voltage node and the second PMOS, and a third NMOS between the second NMOS and the low voltage node.

Following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

According to embodiments, reliability of a buck power stage may be improved by extending the absolute maximum input voltage it can withstand in the disabled (non-switching) state. Specifically, during device qualification/testing processes, the input node of a PMU device in the disabled state may be subjected to greater than a maximum input voltage permitted for reliability purposes. Under such testing/qualification conditions, embodiments avoid damaging the PMU device in the disabled state by applying a force voltage above ground, to the switching node. For a given input voltage (VIN), this technique reduces the voltage across the non-switching transistors of the power stage, and hence the stress experienced by them, to below a maximum input voltage (Vmax) that is permitted for reliability purposes. In certain embodiments, a force voltage of a fixed magnitude is applied to the switching node. In other embodiments, a force voltage of a varying magnitude dependent upon the input voltage, is applied to the switching node.

Figure 1A:
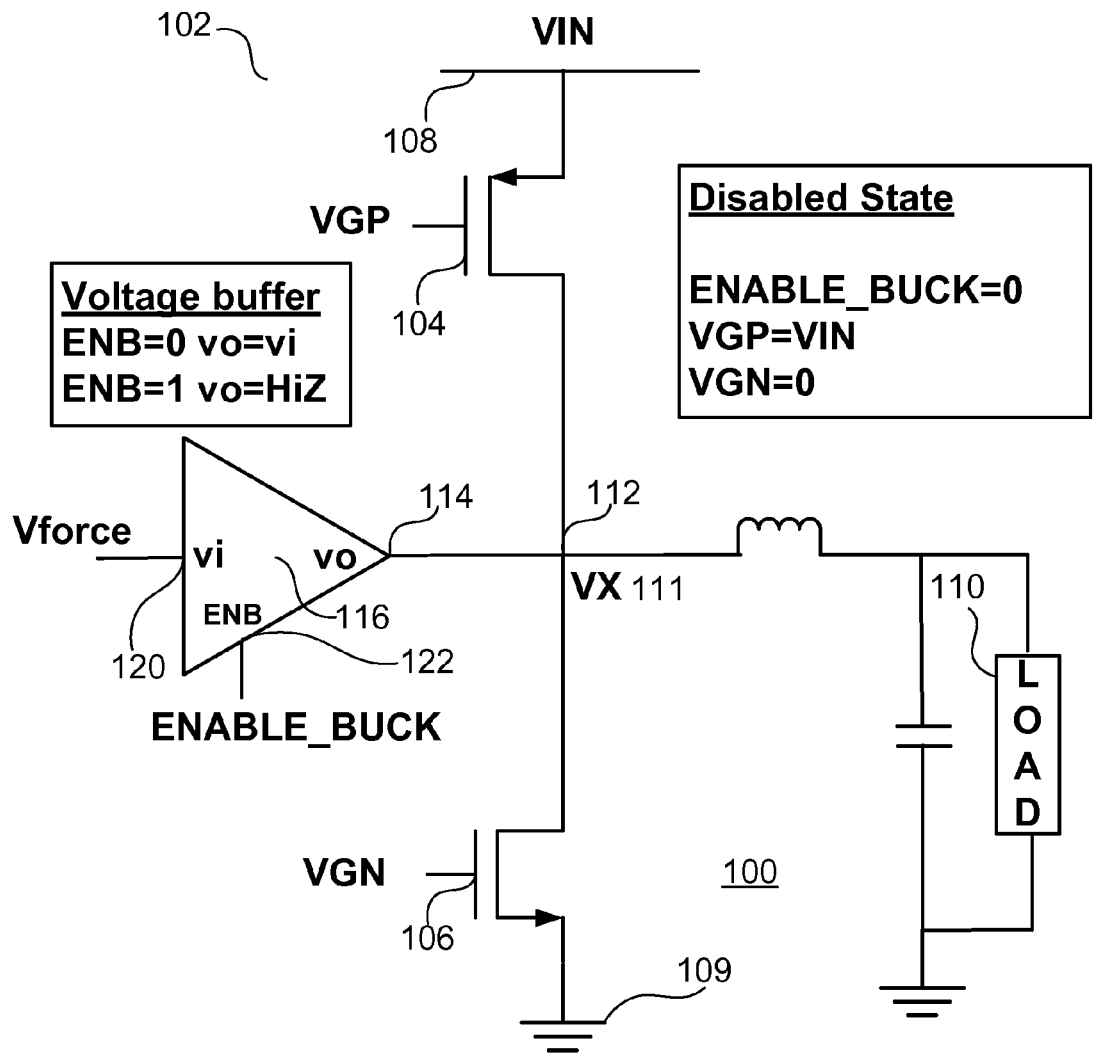
FIG. 1A is a simplified view of a buck converter power stage circuit according to an embodiment.

FIG. 1A is a simplified view of a buck converter power stage circuit according to one embodiment. Here, the circuit 100 comprises a simplified buck converter 102 comprising PFET 104 and NFET 106 coupled between input voltage rail 108 and ground 109 in the manner indicated.

VGP is the gate voltage of the PFET 104. When the buck is in the active switching mode of operation, VGP switches between VIN and 0. VGP is at VIN when the buck is in the disabled (non-switching) state.

VGN is the gate voltage of the NFET 106. When the buck is in the active switching mode of operation, VGN switches between VIN and 0. VGN is at 0 when the buck is in the disabled (non-switching) state.

The switching node 112 is located at the junction of the PFET drain and the NFET drain. This switching node 112 is in communication with a load 110. Voltage VX 111 represents the voltage at the switching node.

The switching node 112 is further in communication with an output node (vo) 114 of a voltage buffer 116. The voltage buffer receives a force voltage (Vforce) at a first input node (vi) 120, and receives an enable input signal (ENABLE_BUCK) 121 at a second (ENB) input node 122.

ENABLE_BUCK is at 0 when the power stage is in the non-switching mode. ENABLE_BUCK is at 1 when the power stage is in the switching mode.

Figure 1B:
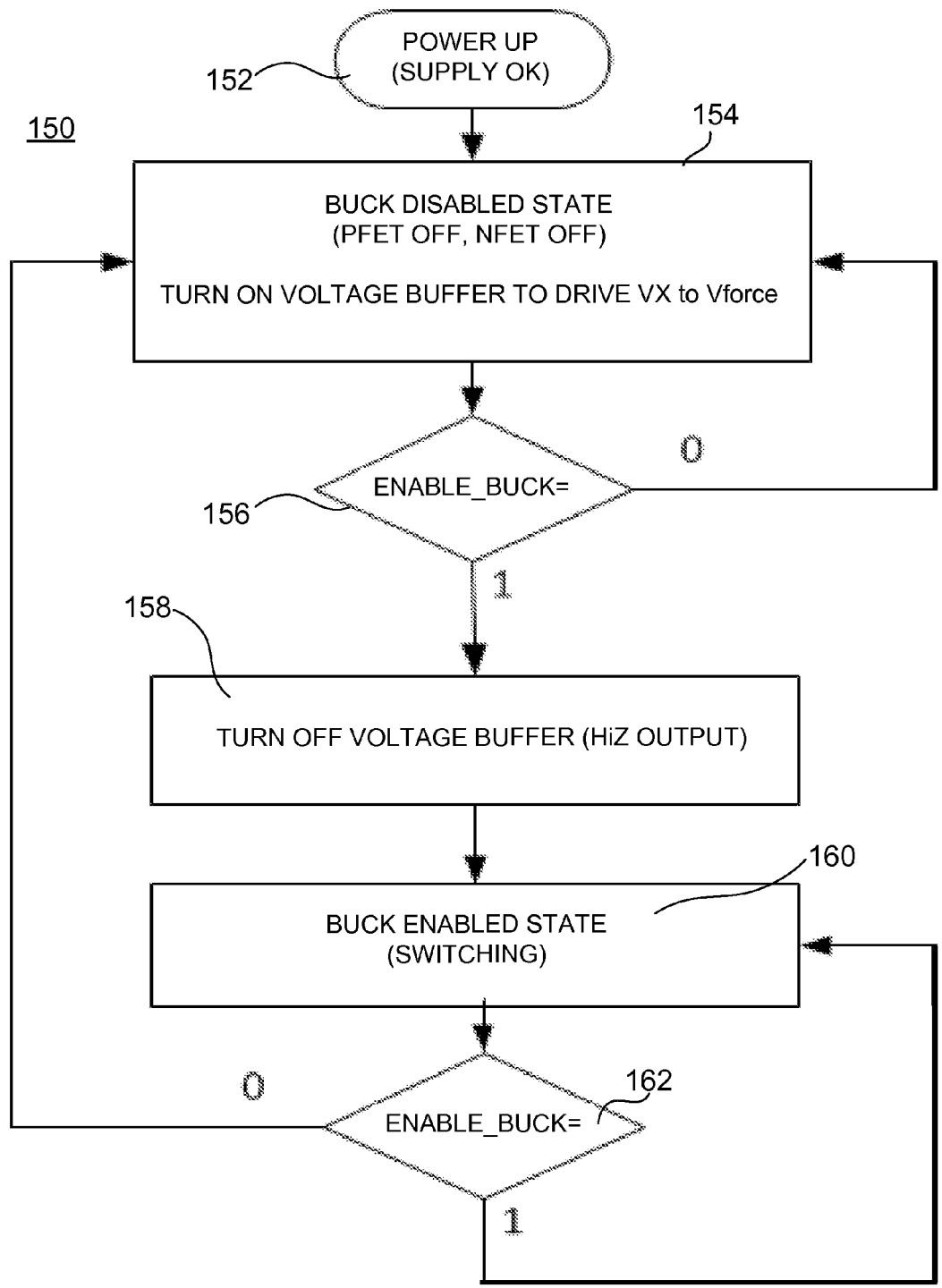
FIG. 1B is a simplified flow diagram showing the process for an input signal of the circuit of FIG. 1A.

Specifically, FIG. 1B is a simplified flow diagram showing the process 150 for the ENABLE_BUCK input signal of the circuit of FIG. 1A. A first step 152 comprises a power up indicating the power supply is functional.

In a second step 154, with the buck in the disabled state, the voltage buffer is turned on to drive the voltage at the switching node (VX) to Vforce. In a third step 156, if the buck is to remain in the disabled (non-switching) state, then the ENABLE_BUCK input signal is maintained at 0 and the flow returns to step 154.

In step 156, if the buck is to be enabled in a switching mode of operation, then the ENABLE_BUCK input signal is raised to 1 and the flow proceeds to step 158. There, the voltage buffer is turned off, allowing the output HiZ voltage to be communicated to the switching node.

In a sixth step 160, it is again determined whether the buck is to continue enabled in the switching state, or is instead to be disabled in the non-switching state. If the former is the case, then in step 162 the ENABLE_BUCK signal is maintained in the high state 1, and the flow returns to the immediately preceding step 160.

If the latter is the case, then in step 162 the ENABLE_BUCK input signal is lowered back to the low state 0, and the flow returns back to the previous step 154.

In this manner, voltage VX at the switching node of the buck power converter is driven by the voltage buffer to a value of Vforce in the disabled state. The |VGD| of PMOS is (VIN−Vforce).

In this case, PMOS reliability is not compromised until VIN exceeds (Vmax+Vforce). In other words, the maximum safe VIN is extended from Vmax to (Vmax+Vforce).

The highest value of Vforce may be chosen not to exceed VLOADmax, where VLOADmax is the maximum voltage that can be applied to the load without exceeding the reliability and leakage limits of the load in the disabled state. Such reliability limits may be determined by considerations of TDDB, HCl, and/or NBTI. For one specific embodiment of a low-voltage core device load, the highest value of Vforce may be chosen to be in the range of between about 0.5V to 1.0V.

Load reliability and leakage may not pose issues in particular use cases. Under such circumstances, Vforce could be chosen to be as high as Vmax considering the NFET stress, thereby bringing the maximum safe VIN to 2*Vmax.

For ease of explanation, FIG. 1A shows the power stage as comprising a single PFET and NFET. As described in detail below in connection with FIG. 4, however, embodiments may also relate to a power stage having stacked power FETs.

Example

The specific circuit just illustrated above in connection with FIGS. 1A-C is now described in connection with one particular example. In this example, the power FET comprises an 1.8V I/O device. The input supply (VIN) operating range is between 1.6V to 2.0V.

For reliability/lifetime purposes, the power FET should not see a voltage higher than Vmax across its terminals. The value of Vmax may depend upon one or more factors including but not limited to:
- the FET type (e.g., P or N)
- the terminals under consideration (e.g., VGD, VGS, VDS etc.)
- possible degradation mechanisms (e.g., TDDB, HCl, NBTI).

In this particular example, for sake of explanation it is assumed that Vmax for a 1.8V I/O FET has a single representative value of 2.5V. Stress on the power FET in the disabled state is represented by the following:
- stress on PFET=|VGD|p=VIN−VX
- stress on NFET=|VGD|n=VX.

Figure 1C:
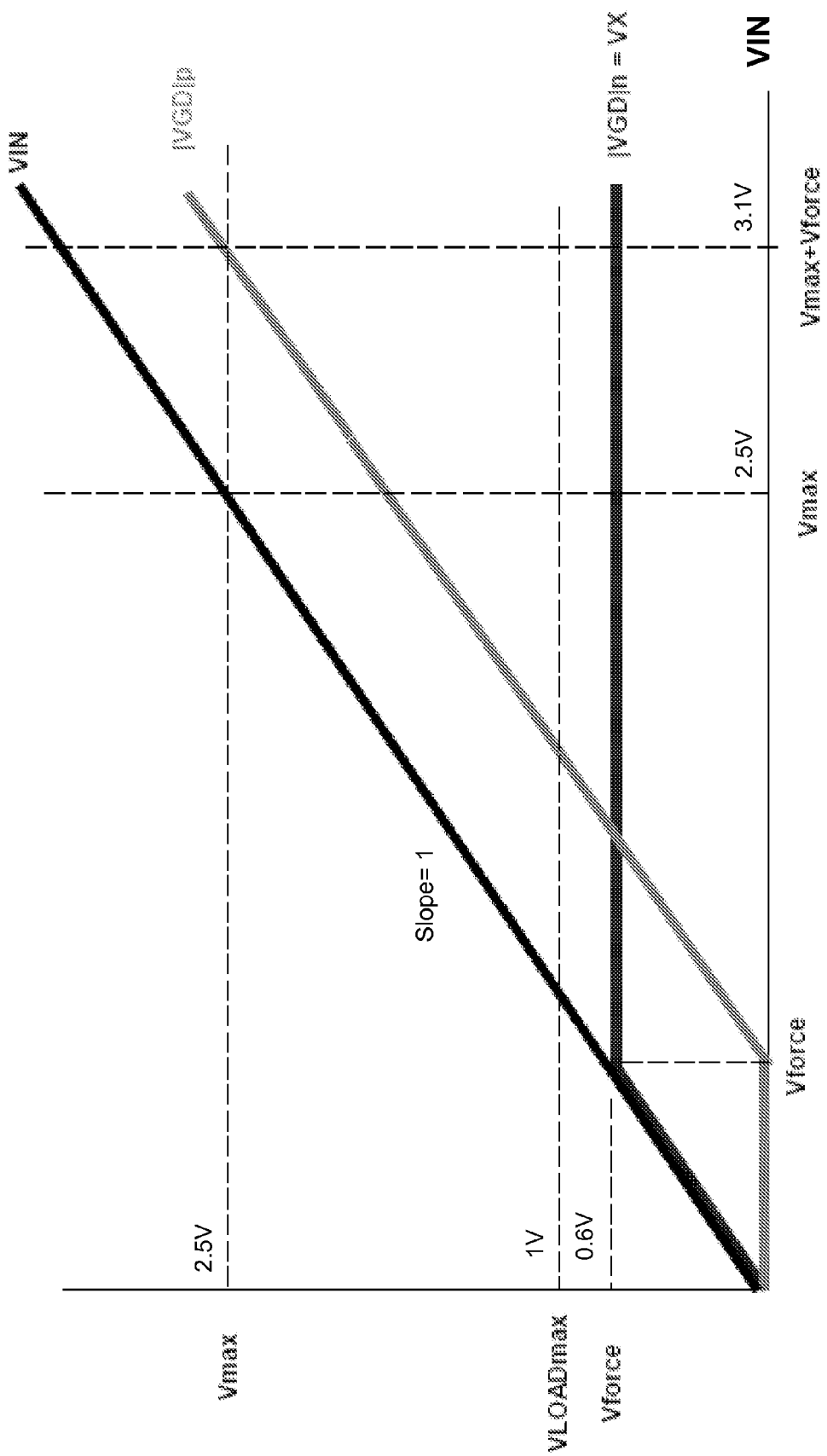
FIG. 1C plots voltage versus input voltage for an embodiment.

FIG. 1C plots voltage versus VIN for this specific example, where:
- Vmax=2.5V;
- VIN=2.0V (operating value); and
- Vforce=0.6V (a constant value).

FIG. 1C shows that in the disabled state, VIN (abs max) is extended from Vmax to the higher Vmax+Vforce.

Figure 1D:
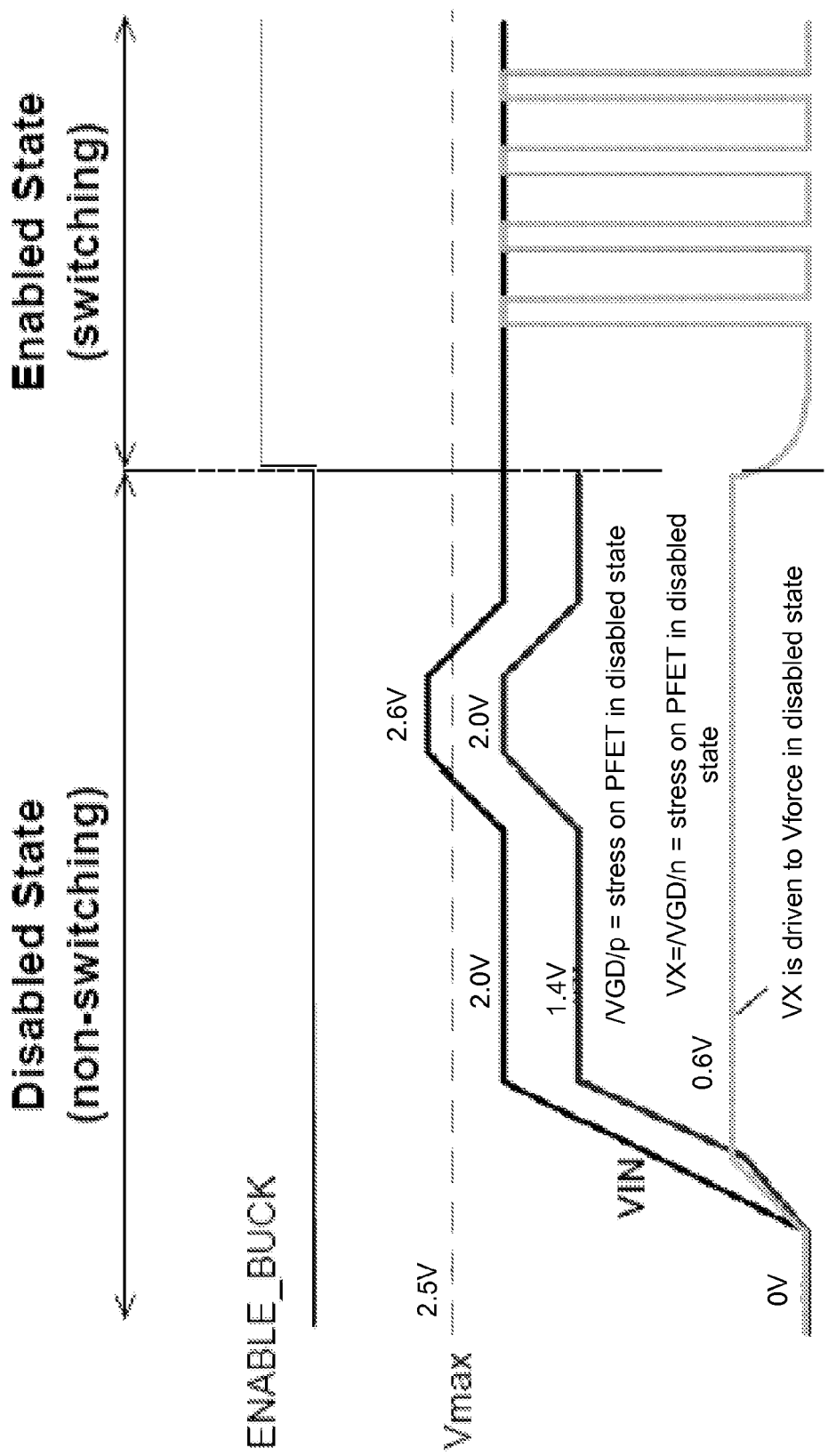
FIG. 1D plots corresponding voltage over time.

FIG. 1D plots corresponding voltage over time for this example. FIG. 1D shows that while VIN momentarily rises above Vmax, the stress on PFET is maintained below Vmax by forcing the voltage (VX) at the switching node to Vforce. In this manner, reliability of the PFET is not compromised.

Figure 2:
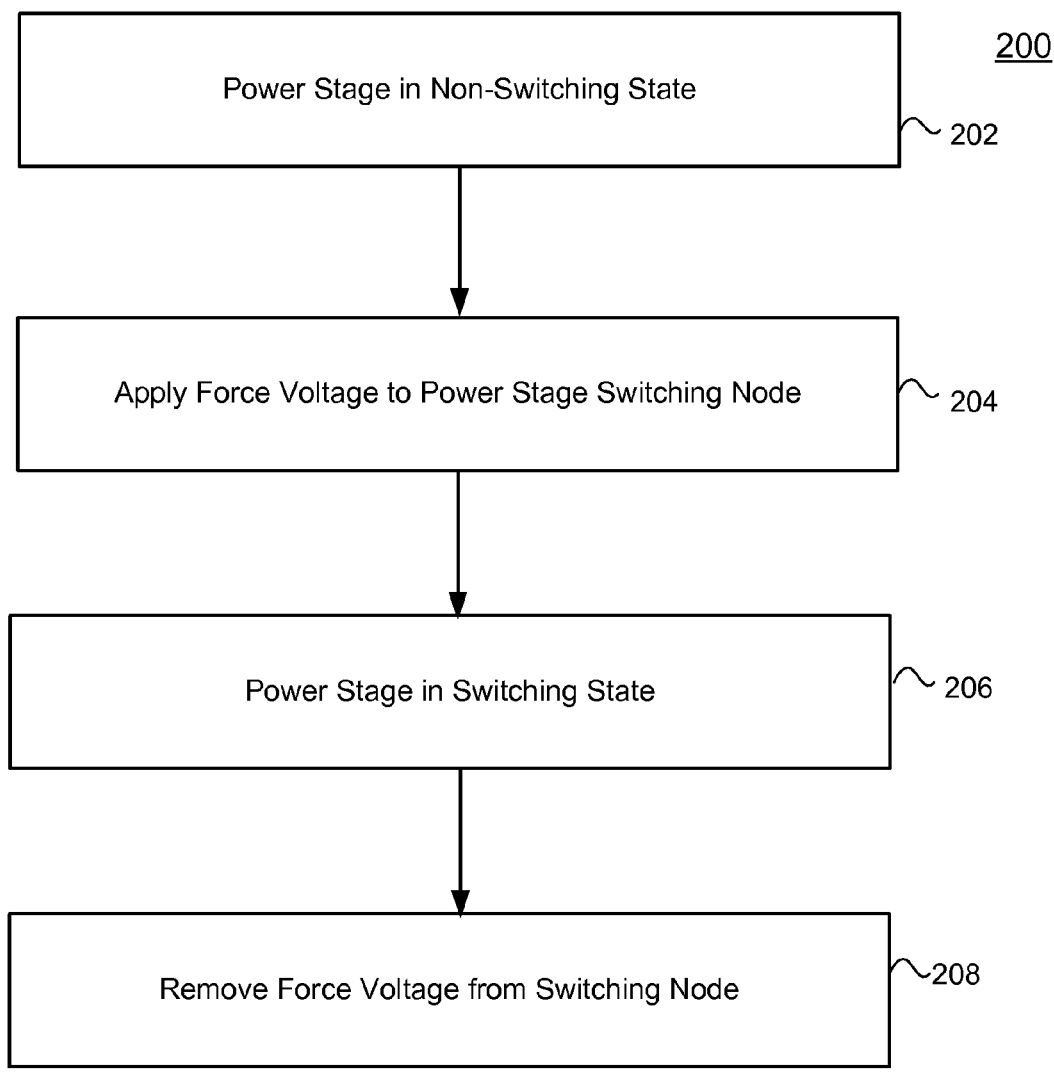
FIG. 2 shows a simplified process flow according to an embodiment.

FIG. 2 is a simplified flow diagram showing a process 200 according to an embodiment. In a first step 202, the power stage is determined to be in the disabled (non-switching) state.

In a second step 204, a force voltage is applied to a switching node of the power stage. In a third step 206, the power stage is determined to be in the enabled (switching) state.

In a fourth step 208, the force voltage is removed from the switching node.

It is noted that variations of the specific embodiment shown in FIGS. 1A-1D, are possible. In one alternative embodiment, the magnitude of the applied force voltage (Vforcex) may be dependent upon VIN (rather than being of a constant magnitude as in the previous embodiment).

Figure 3A:
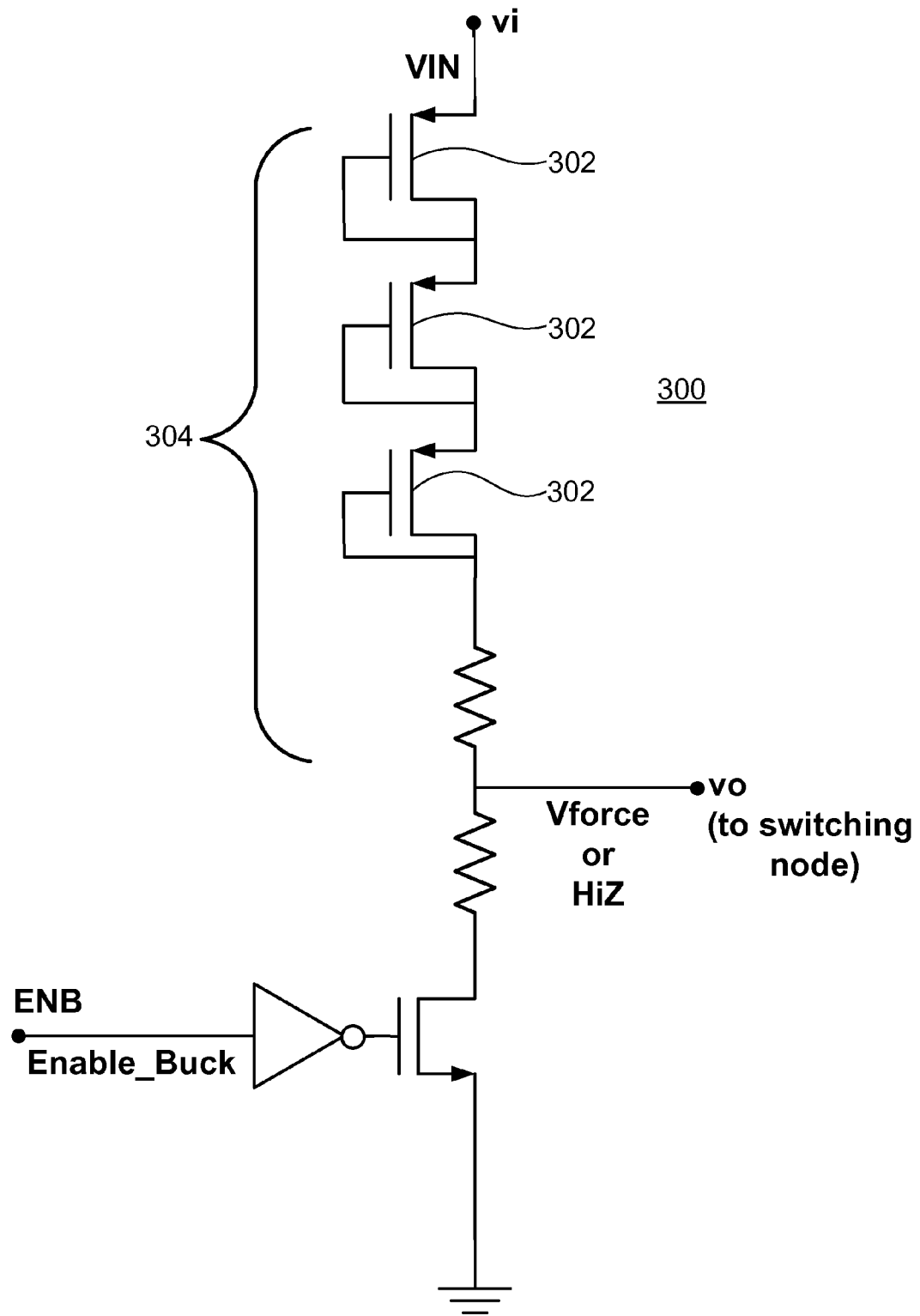
FIG. 3A is a simplified view of a voltage buffer of PMU circuit according to an embodiment.

FIG. 3A thus shows a simplified view of a voltage buffer 300 of a power management circuit according to such an embodiment. This figure shows one possible implementation for the voltage buffer where the Vforce output scales with VIN. In this specific embodiment, the PMOS devices 302 of the voltage buffer serve as diodes in order to create a diode/resistor stack 304. Output from the voltage buffer of FIG. 3A is communicated to a switching node as previously described.

Figure 3B:
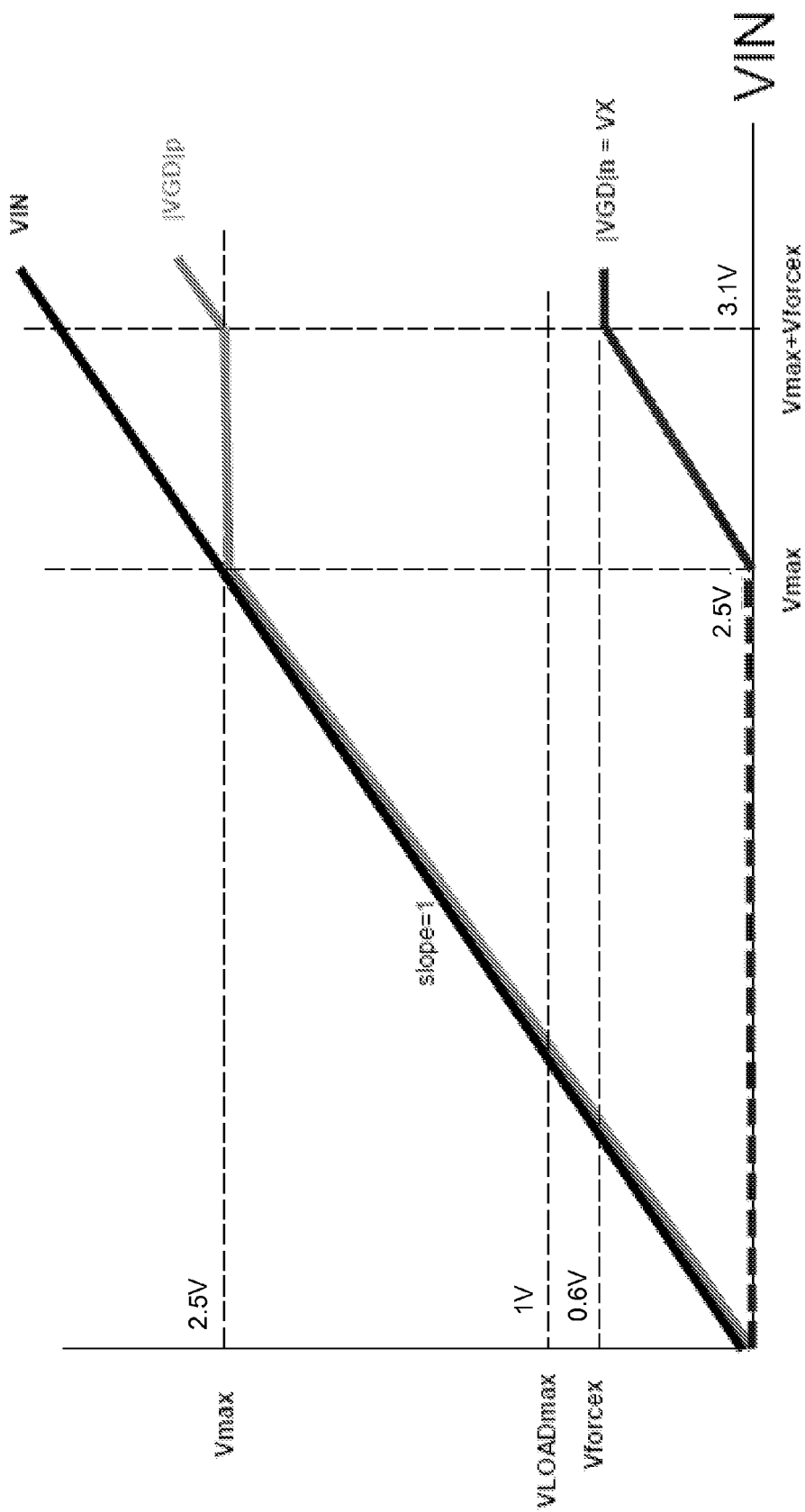
FIG. 3B plots voltage versus input voltage for an embodiment.

FIG. 3B plots voltage versus VIN for the specific voltage buffer embodiment of FIG. 3A, again where:
- Vmax=2.5V;
- VIN=2.0V (operating value); and
- Vforce=0.6V.

Figure 3C:
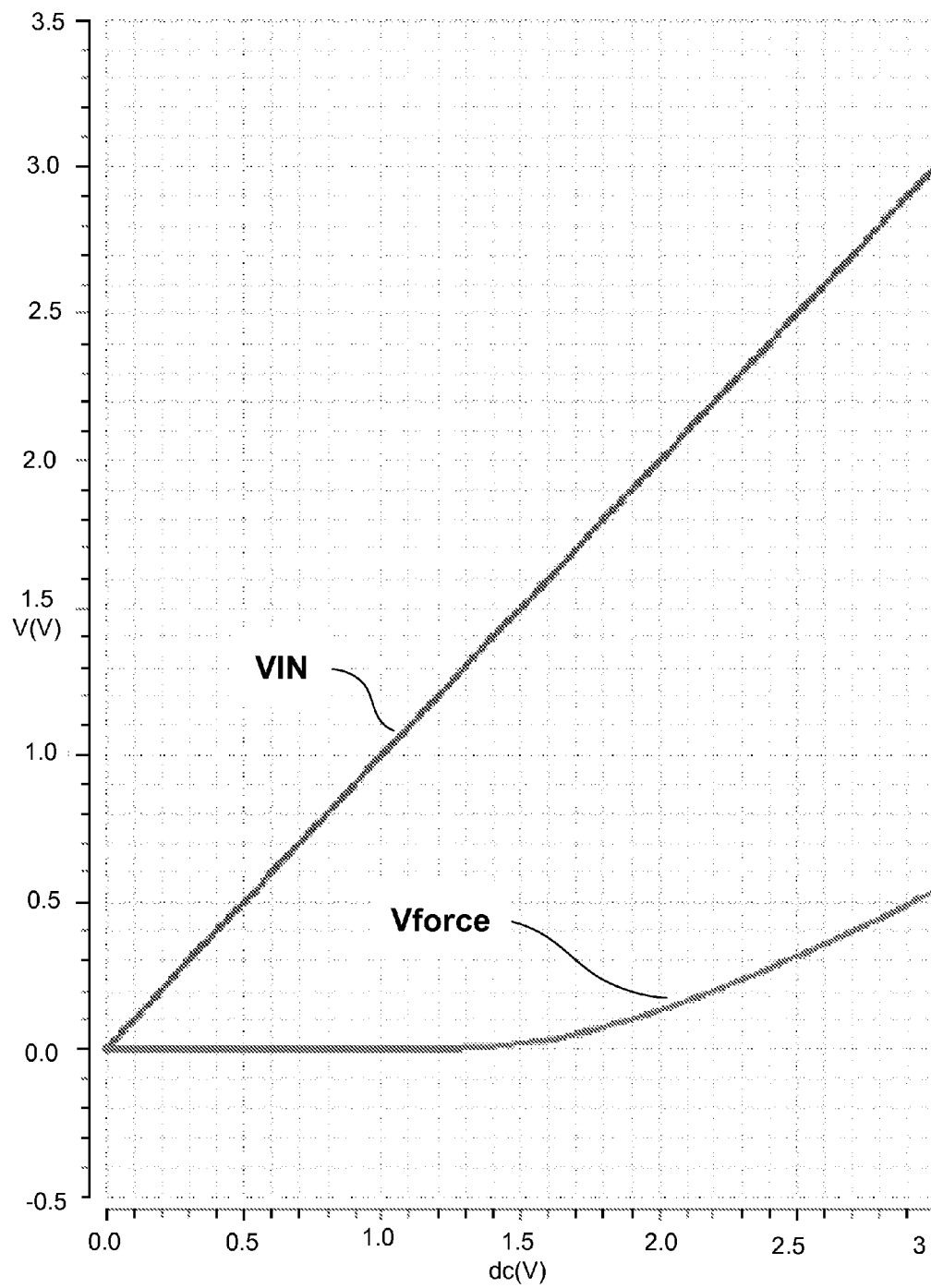
FIG. 3C plots VIN and Vforce for an embodiment.

FIG. 3B shows that in the disabled state, VIN (abs max) is extended from Vmax to the Vmax+Vforcex value. FIG. 3C is an actual plot of VIN and Vforce for the circuit of FIG. 3C.

Figure 4:
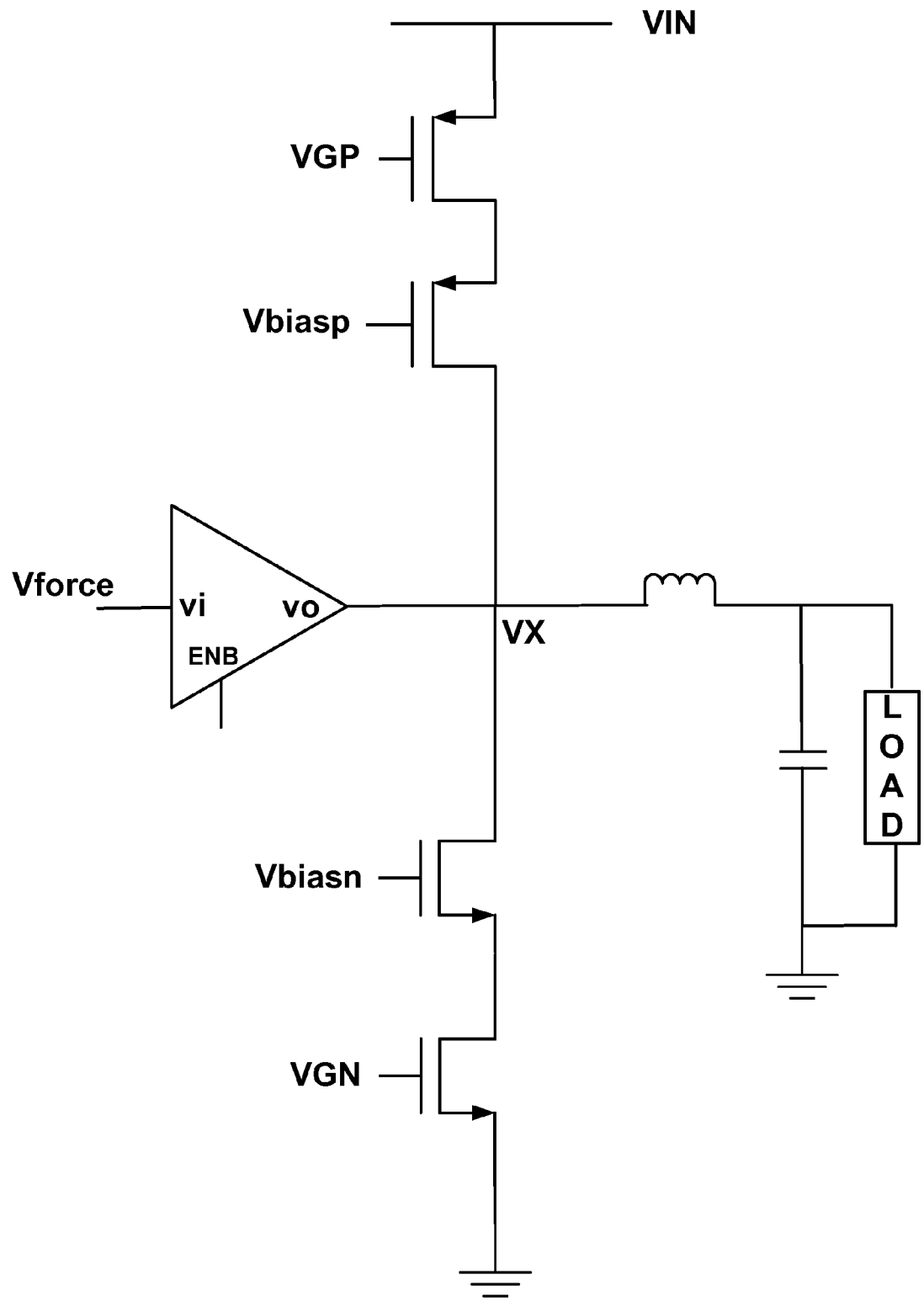
FIG. 4 is a simplified view of a circuit according to an embodiment.

As mentioned above, the structure of the buck switching converter power stage may be more complex than the simplified PFET/NFET shown in the particular circuit of FIG. 1A. FIG. 4 illustrates such an alternative embodiment where the power stage comprises multiple PFET/NFET stacked devices. As shown here, bias voltages (Vbiasp, Vbiasn) are applied to gates of the PMOS/NMOS transistors in the stack.

While FIG. 4 shows a specific embodiment comprising two stacked devices, the use of more is possible depending upon the circumstances.

Buck power switching stages according to embodiments may be particularly suited for power management on SOC devices. Specifically, in such devices the data-handling transistors are constrained to operate within low maximum voltage (Vmax) tolerances.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. An apparatus comprising:
   a buck power stage disposed between a high voltage node and a low voltage node, the buck power stage further comprising a switching node in communication with a load; and
   a voltage buffer configured to apply a force voltage to the switching node in response to an input signal indicating the buck power stage is in a non-switching state, wherein the force voltage is determined such that, when applied to the switching node, the force voltage is configured to keep voltages applied to the buck power stage within a predefined reliability range.

2. The apparatus of claim 1 wherein the voltage buffer is configured to apply the force voltage at a constant value.

3. The apparatus of claim 1 wherein:
   a value of the high voltage node is configured to vary over time; and
   the voltage buffer is configured to vary the voltage force according to the value of the high voltage node to keep the voltages applied to the buck power stage within the predefined reliability range.

4. The apparatus of claim 3 wherein the voltage buffer is configured to apply the force voltage when the value exceeds a maximum permitted for reliability.

5. The apparatus of claim 1 wherein the voltage buffer comprises a diode/resistor stack.

6. The apparatus of claim 1 wherein the buck power stage comprises:
   a first PMOS having a source in communication with the high voltage node and a drain in communication with the switching node; and
   a first NMOS having a drain in communication with the switching node and a source in communication with the low voltage node.

7. The apparatus of claim 6 wherein the buck power stage comprises a stacked device including:
   a second PMOS between the high voltage node and the source of the first PMOS; and
   a second NMOS between the source of the first NMOS and the low voltage node.

8. The apparatus of claim 7 wherein the stacked device further includes:
a third PMOS between the high voltage node and the second PMOS; and
a third NMOS between the second NMOS and the low voltage node.

9. The apparatus of claim 6 wherein the first PMOS and the first NMOS comprise part of a System on Chip (SOC) device further comprising data handling transistors manufactured from a same technology node as the first PMOS and the first NMOS.

10. A system on chip (SOC) comprising:
a data handling transistor manufactured according to a technology node;
a buck power stage comprising a first PMOS transistor manufactured according to the technology node and a first NMOS transistor manufactured according to the technology node, disposed between a high voltage node and a low voltage node, the buck power stage further comprising a switching node in communication with a load; and
a voltage buffer manufactured according to the technology node and configured to apply a force voltage to the switching node in response to an input signal indicating the buck power stage is in a non-switching state, wherein the force voltage is determined such that, when applied to the switching node, the force voltage is configured to keep voltages applied to the buck power stage transistors within a predefined reliability range.

11. The SOC of claim 10 wherein the voltage buffer is configured to apply the force voltage at a constant value.

12. The SOC of claim 10 wherein:
a value of the high voltage node is configured to vary over time; and
the voltage buffer is configured to vary the voltage force according to the value of the high voltage node to keep the voltages applied to the buck power stage transistors within the predefined reliability range.

13. The SOC of claim 10 wherein the voltage buffer comprises a diode/resistor stack.

14. The SOC of claim 10 wherein the buck power stage comprises a stacked device including:
a second PMOS manufactured according to the technology node and located between the high voltage node and the source of the first PMOS; and
a second NMOS manufactured according to the technology node and located between the source of the first NMOS and the low voltage node.

15. The SOC of claim 14 wherein the stacked device further includes:
a third PMOS manufactured according to the technology node and located between the high voltage node and the second PMOS; and
a third NMOS manufactured according to the technology node and located between the second NMOS and the low voltage node.

16. A method comprising:
providing a buck power stage disposed between a high voltage node and a low voltage node, the buck power stage further comprising a switching node in communication with a load;
determining a force voltage such that, when applied to the switching node, the force voltage is configured to keep voltages applied to the buck power stage within a predefined reliability range;
causing a voltage buffer to apply the force voltage to the switching node in response to an input signal indicating the buck power stage is in a non-switching state.

17. The method of claim 16 wherein the voltage buffer is configured to apply the force voltage at a constant value.

18. The method of claim 16 wherein:
a value of the high voltage node is configured to vary over time; and
the voltage buffer is configured to vary the voltage force according to the value of the high voltage node to keep the voltages applied to the buck power stage within the predefined reliability range.

19. The method of claim 16 wherein the voltage buffer comprises a diode/resistor stack.

20. The method of claim 16 wherein the buck power stage comprises a stacked device including:
one or more PMOS transistors between the high voltage node and the switching node and one or more NMOS transistors between the switching node and the low voltage node;
and wherein the method further comprises applying bias voltages to gates of the PMOS and NMOS transistors.

* * * * *